United States Patent
Ito et al.

(10) Patent No.: US 8,890,190 B2
(45) Date of Patent: Nov. 18, 2014

(54) LIGHT-EMITTING DIODE ELEMENT IN WHICH AN OPTICAL SEMICONDUCTOR ELEMENT IS ENCAPSULATED BY AN ENCAPSULATING RESIN LAYER CONTAINING A LIGHT REFLECTION COMPONENT

(75) Inventors: Hisataka Ito, Osaka (JP); Yasushi Inoue, Osaka (JP); Sadahito Misumi, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/403,521

(22) Filed: Feb. 23, 2012

(65) Prior Publication Data

US 2012/0217527 A1    Aug. 30, 2012

(30) Foreign Application Priority Data

Feb. 24, 2011   (JP) .................................. 2011-038701

(51) Int. Cl.
*H01L 33/00* (2010.01)
*H01L 33/56* (2010.01)
*H01L 33/46* (2010.01)

(52) U.S. Cl.
CPC ......... *H01L 33/46* (2013.01); *H01L 2933/0016* (2013.01); *H01L 33/56* (2013.01); *H01L 33/0079* (2013.01)
USPC .............................. 257/98; 257/99; 257/100

(58) Field of Classification Search
USPC .................. 257/88, 89, 98, 99, 100, E25.032
See application file for complete search history.

(56) References Cited

U.S. PATENT DOCUMENTS

| | | | |
|---|---|---|---|
| 2010/0258830 A1 | 10/2010 | Ide et al. | |
| 2010/0320479 A1* | 12/2010 | Minato et al. | 257/88 |
| 2011/0229993 A1* | 9/2011 | Hsieh | 438/29 |
| 2011/0266578 A1 | 11/2011 | Kanisawa et al. | |
| 2011/0291143 A1* | 12/2011 | Kim et al. | 257/98 |

FOREIGN PATENT DOCUMENTS

| | | |
|---|---|---|
| JP | 2003-007929 A | 1/2003 |
| JP | 2005-158932 A | 6/2005 |
| JP | 2010-219324 A | 9/2010 |
| JP | 2010-225597 A | 10/2010 |
| JP | 2010-238846 A | 10/2010 |
| WO | 2009/066430 A1 | 5/2009 |

OTHER PUBLICATIONS

Notification of Reasons for Refusal dispatched Jun. 10, 2014 from the Japanese Patent Office in counterpart Japanese Patent Application No. 2011038701.
Notification of Reasons for Refusal dated Apr. 8, 2014, issued by the Japan Patent Office in corresponding Japanese Application No. 2011-038701.
Notice of Dismissal of Amendment dated Aug. 19, 2014, issued by the Japanese Patent Office in counterpart Application No. 2011-038701.
Decision of Refusal dated Aug. 19, 2014, issued by the Japanese Patent Office in counterpart Application No. 2011-038701.

* cited by examiner

*Primary Examiner* — Bilkis Jahan
(74) *Attorney, Agent, or Firm* — Sughrue Mion, PLLC (57) ABSTRACT

A light-emitting diode element includes an optical semiconductor layer, an electrode unit to be connected to the optical semiconductor layer, and an encapsulating resin layer that encapsulates the optical semiconductor layer and the electrode unit, the encapsulating resin layer containing a light reflection component.

4 Claims, 9 Drawing Sheets

LIGHT-EMITTING DIODE ELEMENT IN WHICH AN OPTICAL SEMICONDUCTOR ELEMENT IS ENCAPSULATED BY AN ENCAPSULATING RESIN LAYER CONTAINING A LIGHT REFLECTION COMPONENT

CROSS-REFERENCE TO RELATED APPLICATION

The present application claims priority from Japanese Patent Application No. 2011-038701 filed on Feb. 24, 2011, the contents of which are hereby incorporated by reference into this application.

BACKGROUND OF THE INVENTION

1. Field of the Invention

The present invention relates to a light-emitting diode element and a light-emitting diode device, in particular, to a light-emitting diode element and a light-emitting diode device in which the light-emitting diode element is flip chip mounted.

2. Description of Related Art

A light-emitting diode device includes a base substrate having a terminal, and a light-emitting diode element mounted thereon, wherein the light-emitting diode element includes an electrode unit, an optical semiconductor layer connected to the electrode unit, and an encapsulating resin layer that encapsulates the electrode unit and the optical semiconductor layer.

In such a light-emitting diode device, conventionally, the electrode unit of the light-emitting diode element and the terminal of the base substrate are connected by wire bonding. However, because of an increased amount of heat involved with improved brightness, and a decrease in brightness from wire shades, in recent years, various methods such as a method by which a light-emitting diode element is flip chip mounted on the base substrate have been examined to improve light-extraction efficiency. To be specific, in such a flip chip mounting, for example, Japanese Unexamined Patent Publication No. 2005-158932 has proposed disposing the electrode unit of the light-emitting diode element to face the terminal of the base substrate, and directly connecting them electrically.

In Japanese Unexamined Patent Publication No. 2005-158932, to further improve light-extraction efficiency, a diffusion film formed from a metal having a high reflectance is provided on the surface of the optical semiconductor layer.

SUMMARY OF THE INVENTION

However, the light-emitting diode device described in Japanese Unexamined Patent Publication No. 2005-158932 is disadvantageous in that the diffusion film has to be provided separately from the optical semiconductor layer or encapsulating resin layer, and therefore its device structure will be complicated to such an extent. Furthermore, production costs of such a light-emitting diode device increase.

An object of the present invention is to provide a light-emitting diode element that can be produced at low costs, and can sufficiently improve light extraction efficiency with a simple structure; and a light-emitting diode device in which the light-emitting diode element is flip chip mounted.

A light-emitting diode element of the present invention includes an optical semiconductor layer, an electrode unit to be connected to the optical semiconductor layer, and an encapsulating resin layer that encapsulates the optical semiconductor layer and the electrode unit, the encapsulating resin layer containing a light reflection component.

A light-emitting diode device of the present invention includes a base substrate, and a light-emitting diode element that is flip chip mounted on the base substrate, wherein the light-emitting diode element includes an optical semiconductor layer, an electrode unit to be connected to the optical semiconductor layer, and an encapsulating resin layer that encapsulates the optical semiconductor layer and the electrode unit, the encapsulating resin layer containing a light reflection component.

In the light-emitting diode element of the present invention, the encapsulating resin layer contains a light reflection component, and therefore light emitted from the optical semiconductor layer receiving electric power from the electrode unit can be reflected at the encapsulating resin layer. Therefore, a light-emitting diode element can be produced with a simple structure at low costs, while light extraction efficiency can be improved without providing a diffusion film such as the one described in Japanese Unexamined Patent Publication No. 2005-158932.

Thus, in a light-emitting diode device in which the above-described light-emitting diode element is flip mounted, light extraction efficiency can be improved.

BRIEF DESCRIPTION OF THE DRAWINGS

FIG. 8 is a process drawing describing a method for producing a light-emitting diode device shown in FIG. 7, (a) illustrating a step of preparing a plurality of light-emitting laminates and a release plate, (b) illustrating a step of laminating the plurality of light-emitting laminates on the release plate, and (c) illustrating a step of encapsulating the top face and side face of the plurality of light-emitting laminates with the encapsulating resin layer.

DETAILED DESCRIPTION OF THE INVENTION

Figure 1:
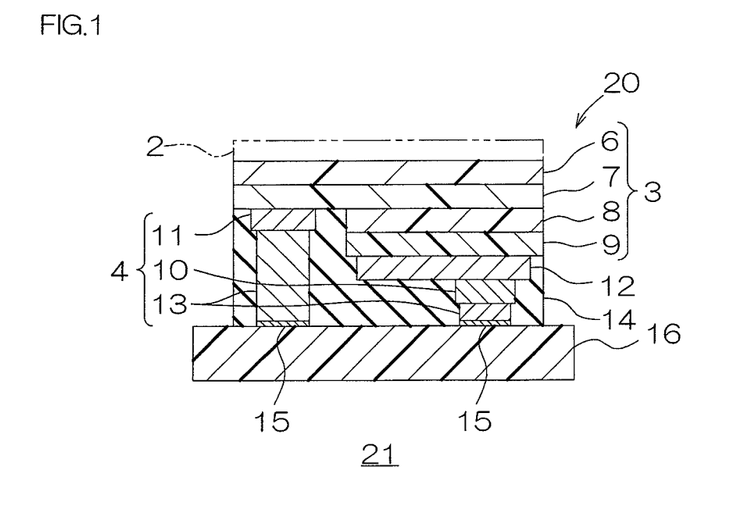
FIG. 1 shows a cross-sectional view of an embodiment of the light-emitting diode device of the present invention.
Figure 2:
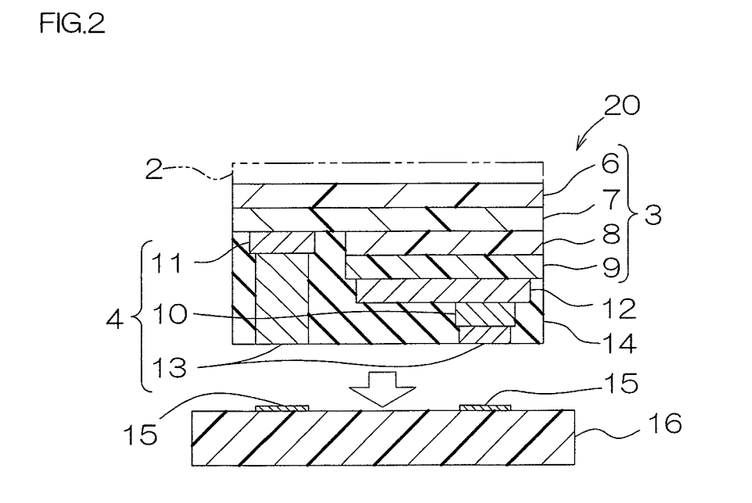
FIG. 2 shows a cross-sectional view illustrating a step of producing the light-emitting diode device of FIG. 1 by flip chip mounting a light-emitting diode element.
Figure 3:
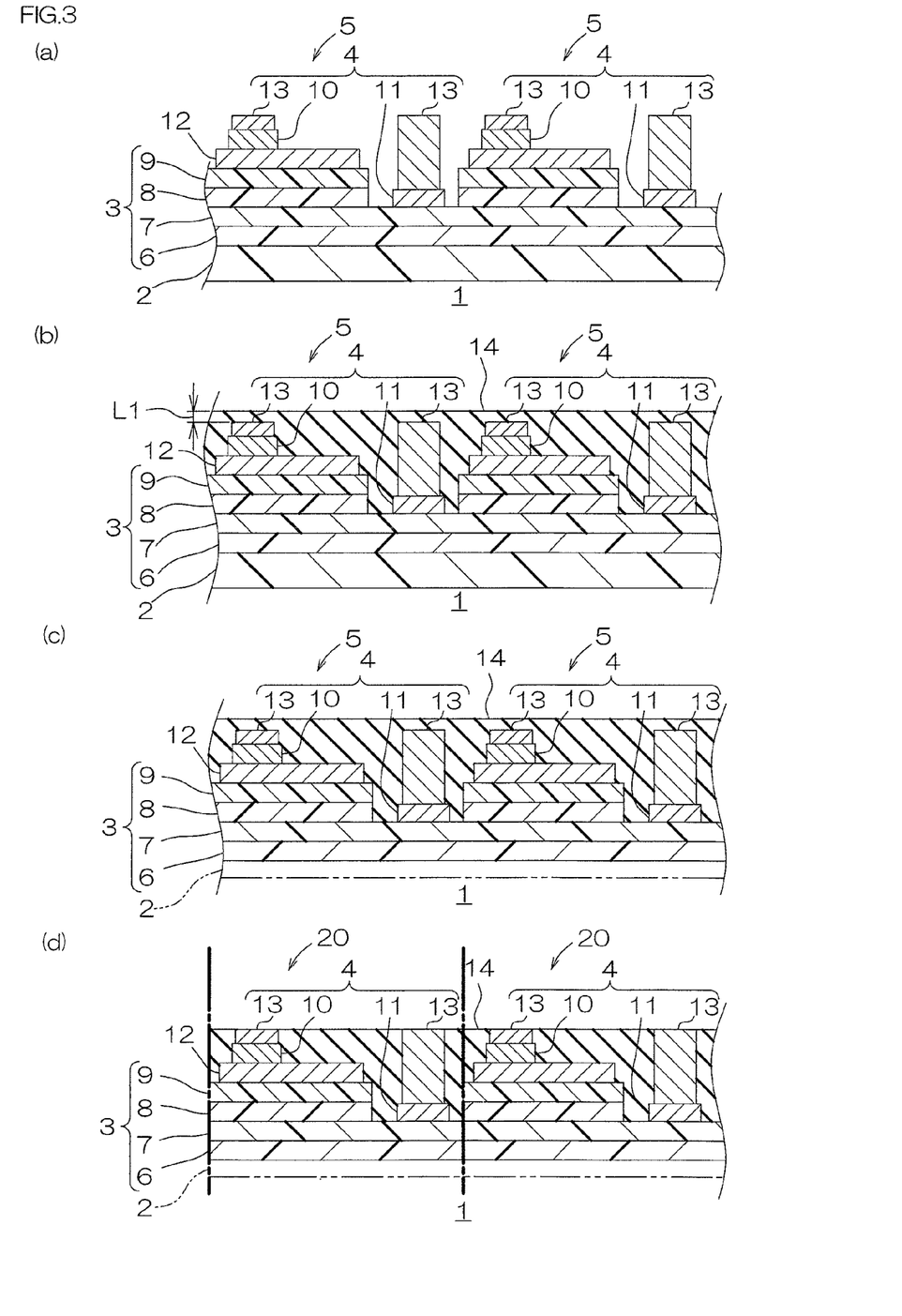
FIG. 3 is a process drawing describing the method for producing the light-emitting diode element shown in FIG. 2,
 (a) illustrating a step of preparing a light-emitting laminate plate,
 (b) illustrating a step of forming an encapsulating resin layer,
 (c) illustrating a step of removing a base substrate, and
 (d) illustrating a step of removing the upper portion of the encapsulating resin layer, and thereafter, cutting the light-emitting laminate plate, thereby producing a light-emitting diode element.

FIG. 1 shows a cross-sectional view of a light-emitting diode device in an embodiment of the light-emitting diode device of the present invention; FIG. 2 shows a cross-sectional view describing a step of producing the light-emitting diode device of FIG. 1 by flip chip mounting a light-emitting diode element; and FIG. 3 shows a process drawing describing a method for producing the light-emitting diode element shown in FIG. 2.

In FIG. 1, a light-emitting diode device 21 includes a base substrate 16, and a light-emitting diode element 20 to be flip chip mounted (ref: FIG. 2) thereon.

The base substrate 16 is a generally flat plate. To be specific, the base substrate 16 is formed from a laminate plate in which a conductor layer formed into a circuit pattern is laminated on an insulating substrate. The insulating substrate is formed, for example, from a silicon substrate, a ceramic substrate, or a polyimide resin substrate. Preferably, the insulating substrate is formed from a ceramic substrate. The conductor layer is formed, for example, from a conductor such as gold, copper, silver, and nickel.

The conductor layer includes terminals 15.

The terminals 15 are formed into a predetermined pattern (a pattern that matches bumps 13 to be described later) with a space provided therebetween in the surface direction (the direction along the base substrate 16, that is, the direction perpendicular to the thickness direction, the surface direction, to be specific, the left-right direction and the depth direction of the sheet in FIG. 1) on the surface of an insulating substrate. The terminals 15 are, although not shown, electrically connected to an electric power supply unit through the conductor layer.

The terminals 15 are formed, for example, from a conductor such as gold, copper, silver, and nickel. These conductors can be used singly, or can be used in combination.

The light-emitting diode element 20 includes, as shown in FIG. 2, an optical semiconductor layer 3, an electrode unit 4 that is electrically connected to the optical semiconductor layer 3, and an encapsulating resin layer 14 that encapsulates the optical semiconductor layer 3 and the electrode unit 4; and after the light-emitting diode element 20 is produced in the production step of FIG. 3 (d) to be described later, the light-emitting diode element 20 is turned upside down (reversed) and mounted on the base substrate 16.

The optical semiconductor layer 3 includes a buffer layer 6, an N-semiconductor layer 7 formed therebelow, a light-emitting layer 8 formed therebelow, and a P-semiconductor layer 9 formed therebelow.

The buffer layer 6 is formed to match the contour of the light-emitting diode element 20, for example, into a generally rectangular flat plate.

The buffer layer 6 buffers mismatching lattice constants of the N-semiconductor layer 7 to be described next.

Examples of buffer materials that form the buffer layer 6 include semiconductors such as element semiconductors (single element semiconductors), oxide semiconductors, and compound semiconductors (excluding oxide semiconductors).

Examples of element semiconductors include 4B elements (4B elements in long-form periodic table, hereinafter referred to as 4B elements) such as Si, Ge, and Sn.

Examples of oxide semiconductors include oxides of main group elements such as $Al_2O_3$, ZnO, and $SnO_2$; and oxides of transition elements such as $TiO_2$, $V_2O_5$, $Cr_2O_3$, $MnO_2$, $Fe_2O_3$, NiO, and $Cu_2O$. These can be used singly, or can be used in combination.

Examples of compound semiconductors include compounds in which a plurality of elements excluding Oxygen are bonded, such as compounds of 3B elements and 5B elements including AlN, AlP, AlAs, AlSb, GaN, GaP, GaAs, GaSb, InN, InP, InAs, InSb, AlGaN, InGaN, AlInN, and AlGaInN; and compounds of 2B elements and 6B elements including ZnS, SnSe, and ZnTe. Preferable examples are compounds of 3B elements and 5B elements.

Of the above-described semiconductors, preferable examples are compound semiconductors.

The buffer layer 6 has a thickness of, for example, 0.5 to 200 nm, preferably 1 to 100 nm.

The N-semiconductor layer 7 is formed on the entire bottom face surface of the buffer layer 6. N-semiconductors that form the N-semiconductor layer 7 are not particularly limited, and known N-semiconductors can be used, including impure semiconductors in which impurities of 5B elements, and further 4B elements are doped (added) in a slight amount to the above-described semiconductors.

The light-emitting layer 8 is formed at the bottom face of the N-semiconductor layer 7, at an end portion of one side in the surface direction (right side in FIG. 2) into a predetermined pattern. That is, the light-emitting layer 8 allows, at an end portion of the other side in the surface direction (left side in FIG. 2) the bottom face of the N-semiconductor layer 7 to be exposed.

Light-emitting materials that form the light-emitting layer 8 include the semiconductors given as the examples of the semiconductors of the above-described buffer layer 6, and preferably compound semiconductors are used.

The light-emitting layer 8 has a thickness of, for example, 20 to 300 nm, preferably 30 to 200 nm.

The P-semiconductor layer 9 is formed on the entire bottom face of the light-emitting layer 8, into the same pattern as that of the light-emitting layer 8. P-semiconductors that form the P-semiconductor layer 9 are not particularly limited, and include known P-semiconductors, for example, impure semiconductors in which impurities of 3B elements, and 2A elements are doped (added) in a slight amount to the above-described semiconductor. Examples of 2A elements include alkaline earth metals such as Be and Mg.

The electrode unit 4 includes an anode 10 and a cathode 11.

The anode 10 is formed below the P-semiconductor layer 9 so as to sandwich a transparent electrode 12, and is electrically connected to the P-semiconductor layer 9 with the transparent electrode 12 interposed therebetween.

The transparent electrode 12 is formed on the bottom face of the P-semiconductor layer 9, and is disposed so as to be included in the P-semiconductor layer 9 when projected in the thickness direction. Examples of electrode materials that form the transparent electrode 12 include metal oxides such as indium tin oxide (ITO), zinc oxide (ZnO), and tin oxide ($SnO_2$), and the transparent electrode 12 has a thickness of, for example, 10 to 300 nm, preferably 20 to 200 nm.

The anode 10 is formed into a pattern that is included in the transparent electrode 12 when projected in the thickness direction.

Examples of electrode materials that form the anode 10 include gold and aluminum. A preferable example is gold. The anode 10 has a thickness of, for example, 10 to 300 nm, preferably 20 to 200 nm.

The cathode 11 is formed below the N-semiconductor layer 7, and is formed, to be specific, on the bottom face of the N-semiconductor layer 7 exposed from the P-semiconductor layer 9 and the light-emitting layer 8. The cathode 11 is electrically connected to the N-semiconductor layer 7.

Examples of electrode materials that form the cathode 11 include gold and aluminum. A preferable example is gold. The cathode 11 has a thickness of, for example, 10 to 300 nm, preferably 20 to 200 nm.

The electrode unit 4 also includes bumps 13.

The bumps 13 are formed on the bottom face of the anode 10 and the bottom face of the cathode 11. The bumps 13 are formed into a pattern so that the bumps 13 are included in the anode 10 and the cathode 11, respectively, when viewed from the top. The bumps 13 are formed into substantially the same pattern as that of the terminals 15.

Examples of materials that form the bumps 13 include conductors such as gold, silver, lead, tin, and alloys thereof (to be specific, solder).

The thickness of the bumps 13 are adjusted so that the bottom face of the bump 13 that is formed on the bottom face of the anode 10 and the bottom face of the bump 13 that is formed on the bottom face of the cathode 11 have the same height (depth) before the flip chip mounting. That is, the thicknesses of the bumps 13 are adjusted so that the bumps 13 are at the same position (position in the thickness direction) when the bumps 13 are projected in the surface direction (direction perpendicular to the thickness direction).

The encapsulating resin that forms the encapsulating resin layer 14 contains, for example, an encapsulating material and a light reflection component.

The encapsulating material is not particularly limited, and include, for example, thermosetting resins such as thermosetting silicone resin, epoxy resin, thermosetting polyimide resin, phenolic resin, urea resin, melamine resin, unsaturated polyester resin, diallyl phthalate resin, and thermosetting urethane resin. Preferable examples are thermosetting silicone resin, and epoxy resin.

Examples of light reflection components include white compounds, to be specific, white pigments.

Examples of such white pigments include white inorganic pigments. Examples of white inorganic pigments include oxides such as titanium oxide, zinc oxide, and zirconium oxide; carbonates such as white lead (lead carbonate), and calcium carbonate; and clay minerals such as kaolin (kaolinite).

A preferable example of white inorganic pigments is oxide, and a more preferable example is titanium oxide.

When titanium oxide is used, characteristics such as a high whiteness degree, a high light reflectivity, excellent covering characteristics, excellent colorability, high dispersiveness, excellent weather resistance, and high chemical stability can be obtained.

An example of such a titanium oxide is, to be specific, $TiO_2$ (titanium oxide (IV), titanium dioxide).

The crystal structure of titanium oxides is not particularly limited, and include, for example, rutile, brookite, and anatase. A preferable example is rutile.

The crystal system of titanium oxides is not particularly limited. For example, the crystal system is a tetragonal system, or orthorhombic system. A preferable example is a tetragonal system (to be specific, rutile structure).

When the crystal structure and the crystal system of the titanium oxide are rutile and tetragonal system, respectively, even if the encapsulating resin layer 14 is exposed to a high temperature for a long period of time, reduction in reflectance of light (particularly to light having a wavelength of around 450 nm) can be prevented effectively.

The light reflection component is particulate, and its shape is not limited. The shape can be, for example, a spherical shape, a plate shape, or a needle shape. The average of the maximum length of the light reflection component (when spherical, its average particle size) is, for example, 1 to 1000 nm. The average of the maximum length is measured by using a laser diffraction/scattering particle size distribution analyzer.

The mixing ratio of the light reflection component relative to the encapsulating resin is, for example, 5 to 90 mass %, preferably 10 to 60 mass % in view of colorability and light reflectivity.

The above-described light reflection component is dispersed and mixed in the encapsulating material uniformly.

A filler can be further added to the encapsulating resin. That is, the filler can be used in combination with the light reflection component (to be specific, white pigment).

Examples of fillers include, known fillers excluding the above-described white pigment. To be specific, examples of fillers include inorganic fillers such as silica powder, talc powder, alumina powder, aluminum nitride powder, and silicon nitride powder.

In view of reducing the linear expansion coefficient of the encapsulating resin layer 14, preferably, silica powder is used as the filler.

Examples of silica powder include molten silica powder and crystalline silica powder. A preferable example is molten silica powder (that is, quartz glass powder).

Examples of the shape of the filler include a spherical shape, a plate shape, and a needle shape. In view of excellent filling performance and flowability, the shape of the filler is preferably spherical.

Therefore, as the silica powder, preferably, a spherical molten silica powder is used.

The average of the maximum length of the filler (when spherical, its average particle size) is, for example, 5 to 60 μm, preferably 15 to 45 μm. The average of the maximum length is measured by using a laser diffraction/scattering particle size distribution analyzer.

The mixing ratio of the filler is adjusted so that the total amount of the filler and the light reflection component relative to, for example, the encapsulating resin is 10 to 80 mass %, and in view of reducing the linear expansion coefficient and ensuring flowability, the mixing ratio of the total amount of the filler and the light reflection component relative to the encapsulating resin is adjusted to be preferably 25 to 75 mass %, and more preferably 40 to 60 mass %.

The encapsulating resin is prepared as an encapsulating resin composition, by blending the above-described encapsulating material, the light reflection component, and a filler to be added as necessary, and mixing the mixture uniformly. The encapsulating resin composition is formed into a paste, or a sheet.

With the encapsulating resin layer 14, the side face of the bump 13 corresponding to the anode 10, the bottom face (exposed from the bump 13) and side face of the anode 10, the bottom face (exposed from the anode 10) and the side face of the transparent electrode 12, the bottom face (exposed from the transparent electrode 12) and the side face of the P-semiconductor layer 9, and the side face of the light-emitting layer 8 are covered. The bottom face of the bump 13 corresponding to the anode 10 is exposed from the encapsulating resin layer 14.

With the encapsulating resin layer 14, the side face of the bump 13 corresponding to the cathode 11, and the bottom face (exposed from the bump 13) and the side face of the cathode 11 are covered. The bottom face of the bump 13 corresponding to the cathode 11 is exposed from the encapsulating resin layer 14.

Furthermore, with the encapsulating resin layer 14, the bottom face (the bottom face of the N-semiconductor layer 7 exposed from the light-emitting layer 8 and the cathode 11) of the N-semiconductor layer 7 is also covered.

The optical semiconductor layer 3 and the electrode unit 4 are encapsulated with the encapsulating resin layer 14 in this manner.

The above-described light-emitting diode element 20 is obtained, as shown in FIG. 3 (c) and FIG. 3 (d), by cutting the light-emitting laminate plate 1 in which a plurality of light-emitting laminates 5 encapsulated with the encapsulating resin layer 14 are arranged in arrays. To be specific, in the light-emitting diode element 20, a light-emitting laminate 5 including an optical semiconductor layer 3 and an electrode unit 4 is encapsulated with the encapsulating resin layer 14, and is obtained by cutting out the above-described light-emitting laminate plate 1 into pieces. In particular, the light-emitting diode element 20 is obtained by the production method shown in FIG. 3 (a) to FIG. 3 (d).

That is, in this method, first, as shown in FIG. 3 (a), the light-emitting laminate plate 1 is prepared.

The light-emitting laminate plate 1 includes a support substrate 2, a plurality of optical semiconductor layers 3 formed thereon, and a plurality of electrode units 4 formed thereon. In the light-emitting laminate plate 1, a plurality of light-emitting laminates 5 each including a support substrate 2, an optical semiconductor layer 3, and an electrode unit 4 are arranged in arrays.

The support substrate 2 is formed, for example, into a generally disc shape when viewed from the top. The support substrate 2 supports the optical semiconductor layer 3 and the electrode unit 4.

Examples of supporting materials that form the support substrate 2 include $Al_2O_3$ (sapphire), SiC, Si, and GaN. A preferable example is sapphire.

The support substrate 2 has a thickness of, for example, 100 to 1000 μm, preferably 200 to 800 μm.

The optical semiconductor layer 3 includes the buffer layer 6, the N-semiconductor layer 7 formed thereon, the light-emitting layer 8 formed thereon, and the P-semiconductor layer 9 formed thereon.

To prepare a light-emitting laminate plate 1, first, a support substrate 2 is prepared, and optical semiconductor layers 3 are laminated thereon by, for example, a known growth method such as epitaxy, and thereafter, electrode units 4 are laminated by a known patterning method. The light-emitting layer 8 and the P-semiconductor layer 9 in the optical semiconductor layer 3 are formed into the above-described pattern, for example, by etching using a mask after the above-described growth method.

Next, in this method, as shown in FIG. 3 (b), an encapsulating resin layer 14 is formed so as to cover the plurality of optical semiconductor layers 3 and the plurality of electrode units 4.

To form the encapsulating resin layer 14, the above-described encapsulating resin composition is applied on the plurality of optical semiconductor layers 3 including the electrode units 4 by an application method using a laminator or an applicator to form a coating. Thereafter, when the encapsulating material is a thermosetting resin, the coating is cured by heating.

When the encapsulating resin composition is formed into a sheet, the encapsulating resin layer 14 can also be molded by placing the encapsulating resin composition on the plurality of optical semiconductor layers 3, and curing the encapsulating resin composition by heating.

Furthermore, when the encapsulating resin composition contains a powder thermosetting resin, the encapsulating resin layer 14 can also be molded by compression molding the encapsulating resin composition with a compression molding machine, while heating the encapsulating resin composition to be cured.

The encapsulating resin layer 14 is formed in this manner.

The top face of the thus formed encapsulating resin layer 14 is formed above the top face of the electrode unit 4 (that is, above the top face of the bump 13).

Length L1 between the top face of the encapsulating resin layer 14 and the top face of the bump 13 is, for example, 2000 μm or less, preferably 10 to 1000 μm. The optical semiconductor layer 3 and the electrode unit 4 are thus encapsulated with the encapsulating resin layer 14.

Then, as shown in FIG. 3 (c), the support substrate 2 is removed from the optical semiconductor layer 3.

For the removal of the support substrate 2, for example, etching such as dry etching, and wet etching, or machine processing such as grind processing (to be specific, grinding) is used.

Then, as shown in FIG. 3 (d), the encapsulating resin layer 14 is partially removed so as to expose the top face of the electrode unit 4.

To be specific, in the encapsulating resin layer 14, the upper portion that is above the top face of the bump 13 is removed.

For the removal of the upper portion of the encapsulating resin layer 14, for example, the above-described etching, or machine processing is used.

The encapsulating resin layer 14 with its upper portion removed allows the top face of the bump 13 to be exposed, and allows the top face of the encapsulating resin layer 14 surrounding the top face of the bump 13 to be flush with the top face of the bump 13.

A plurality of light-emitting diode elements 20 are thus formed integrally, corresponding to a plurality of light-emitting laminates 5, the light-emitting laminate 5 including the optical semiconductor layer 3, the electrode unit 4, and the encapsulating resin layer 14.

Thereafter, as shown in the broken line (one dash) in FIG. 3 (*d*), the light-emitting laminate plate 1 with the encapsulating resin layer 14 formed is cut (die cut) in correspondence with the light-emitting diode elements 20.

That is, the light-emitting laminate plate 1 is cut out into a plurality of light-emitting diode elements 20. To be specific, the encapsulating resin layer 14, the buffer layer 6, and the N-semiconductor layer 7 surrounding the electrode unit 4, the light-emitting layer 8, and the P-semiconductor layer 9 are die cut along the thickness direction shown by the broken line (one dash) in FIG. 3 (*d*).

The light-emitting diode elements 20 can be obtained in this manner.

Next, as shown in FIG. 2, the light-emitting diode elements 20 obtained are turned upside-down (reversed); and the light-emitting diode elements 20 and the base substrate 16 are disposed to face each other. Thereafter, as shown in FIG. 1, the bump 13 of the electrode unit 4, and the terminal 15 are electrically connected, thereby flip chip mounting the light-emitting diode element 20 on the base substrate 16.

In flip chip mounting, the light-emitting diode element 20 is placed on the base substrate 16 so that the bumps 13 and the terminals 15 are adjacent to each other in the thickness direction, and then the bumps 13 are allowed to reflow, for example, by heating or ultrasonic waves.

The bump 13 is thus brought into contact with the terminal 15, and the light-emitting diode element 20 is flip mounted on the base substrate 16. A light-emitting diode device 21 including the light-emitting diode element 20 and the base substrate 16 can be obtained in this manner.

Figure 10:
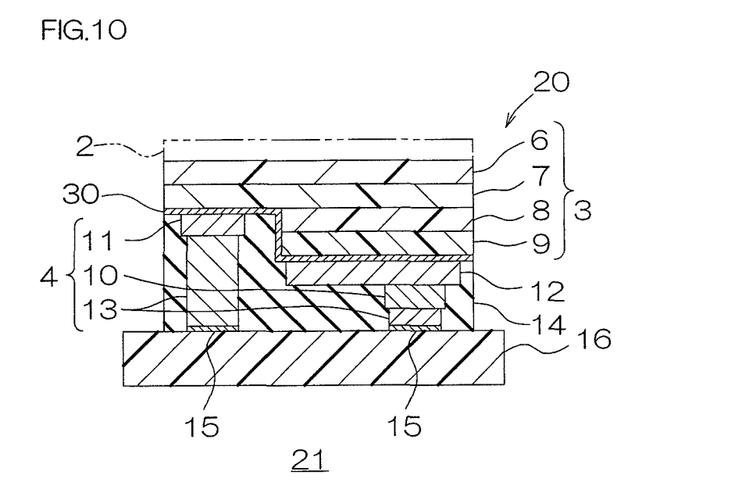
FIG. 10 shows a cross-sectional view of a light-emitting diode device of Comparative Example 1 (embodiment in which a diffusion film is included).

In this light-emitting diode element 20, the encapsulating resin layer 14 contains a light reflection component, and therefore light emitted from the optical semiconductor layer 3 based on electric power supply received from the electrode unit 4 can be reflected by the encapsulating resin layer 14. Thus, without providing a diffusion film (ref: FIG. 10) as described in Japanese Unexamined Patent Publication No. 2005-158932, a light-emitting diode element 20 can be produced with a simple structure and at low costs, while improving light extraction efficiency.

Thus, in a light-emitting diode device 21 in which the light-emitting diode element 20 is flip mounted, light extraction efficiency can be improved.

In embodiments shown by the solid lines in FIG. 1 to FIG. 3, the light-emitting diode element 20 and the light-emitting diode device 21 are obtained by removing the support substrate 2 entirely, however, as shown by the phantom line in FIG. 1 to FIG. 3, the light-emitting diode element 20 and the light-emitting diode device 21 can also be obtained by partially leaving the support substrate 2.

That is, without removing the support substrate 2 entirely from the optical semiconductor layer 3 as shown by the solid line in FIG. 3 (*c*), the upper portion of the support substrate 2 is allowed to remain as shown by the phantom line in FIG. 3 (*c*) by removing only the lower portion of the support substrate 2.

The thickness of the support substrate 2 after the removal of the lower portion relative to the thickness of the support substrate 2 before the removal is, for example, 80% or less, preferably 30% or less, and usually 1% or more, to be specific, for example, 320 μm or less, preferably 10 to 120 μm.

When the thickness is above the above-described range, light extraction efficiency may decrease, on the other hand, when the thickness is below the above-described range, the effects as described next of preventing damages to the electrode unit 4 by supporting the optical semiconductor layer 3 may not be brought out sufficiently.

As shown by the phantom line in FIG. 3 (*c*), when only the lower portion of the support substrate 2 is removed, in the removal of the upper portion of the encapsulating resin layer 14 shown in FIG. 3 (*d*), the stress applied on the electrode unit 4 can be reliably supported by the remaining upper portion of the support substrate 2 through the optical semiconductor layer 3. Thus, damages to the electrode unit 4 can be further prevented.

On the other hand, as shown in the solid line in FIG. 3 (*c*), when the support substrate 2 is removed entirely, in the light-emitting diode device 21 shown in FIG. 1, light emitted from the optical semiconductor layer 3 of the light-emitting diode element 20 upwardly will not be blocked, and therefore light-extraction efficiency can be improved.

Figure 4:
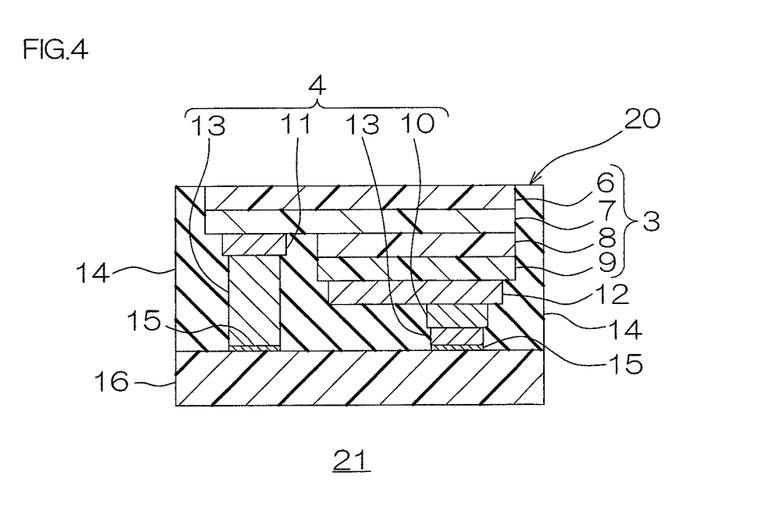
FIG. 4 shows a cross-sectional view of a light-emitting diode device in another embodiment of the light-emitting diode device of the present invention (embodiment in which the bottom face and side face of the optical semiconductor layer of the light-emitting diode element is encapsulated with the encapsulating resin layer).
Figure 5:
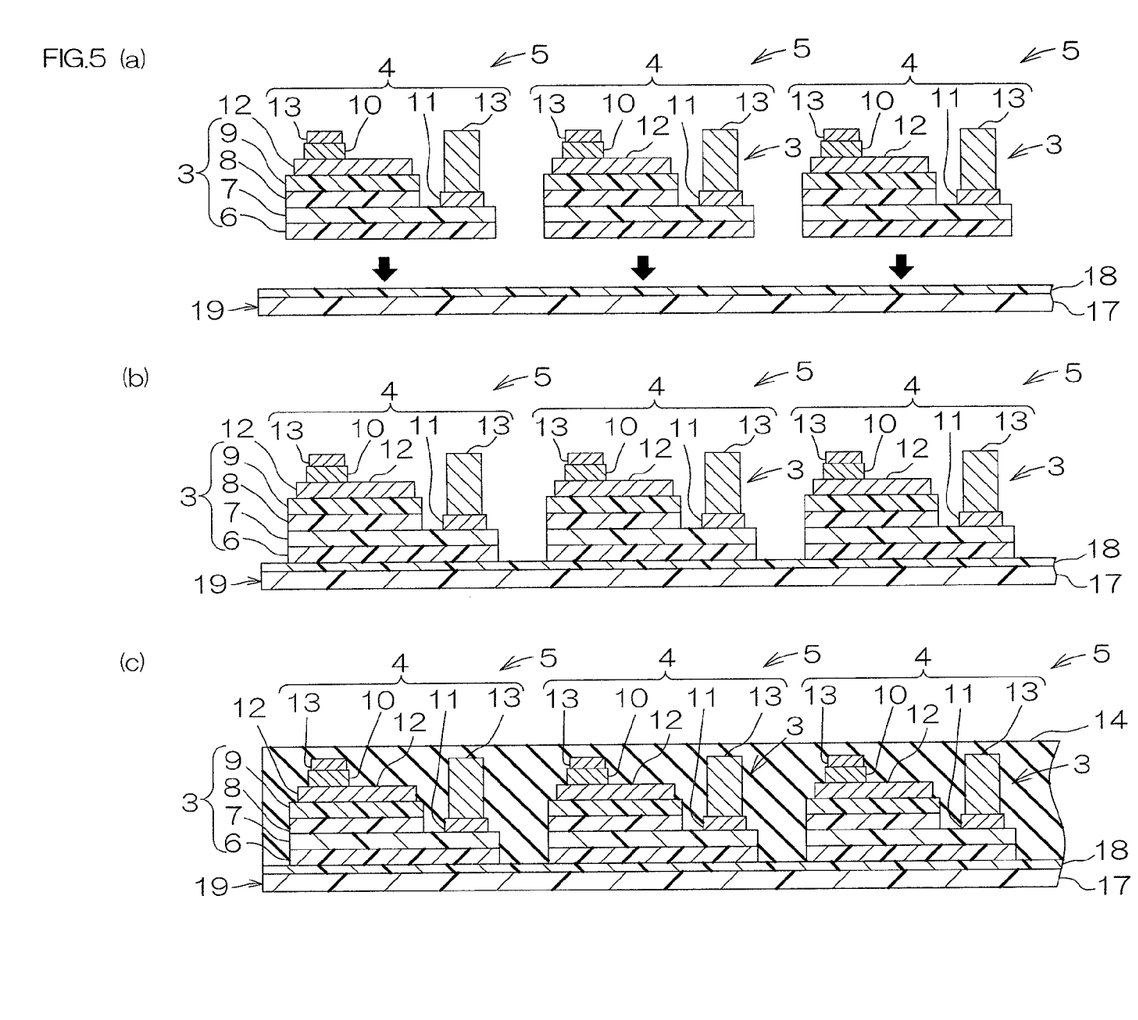
FIG. 5 is a process drawing describing a method for producing the light-emitting diode device shown in FIG. 4,
 (a) illustrating a step of preparing a plurality of light-emitting laminates, and a release plate,
 (b) illustrating a step of laminating the plurality of light-emitting laminates on the release plate, and
 (c) illustrating a step of encapsulating the top face and side face of the plurality of light-emitting laminates with the encapsulating resin layer.
Figure 6:
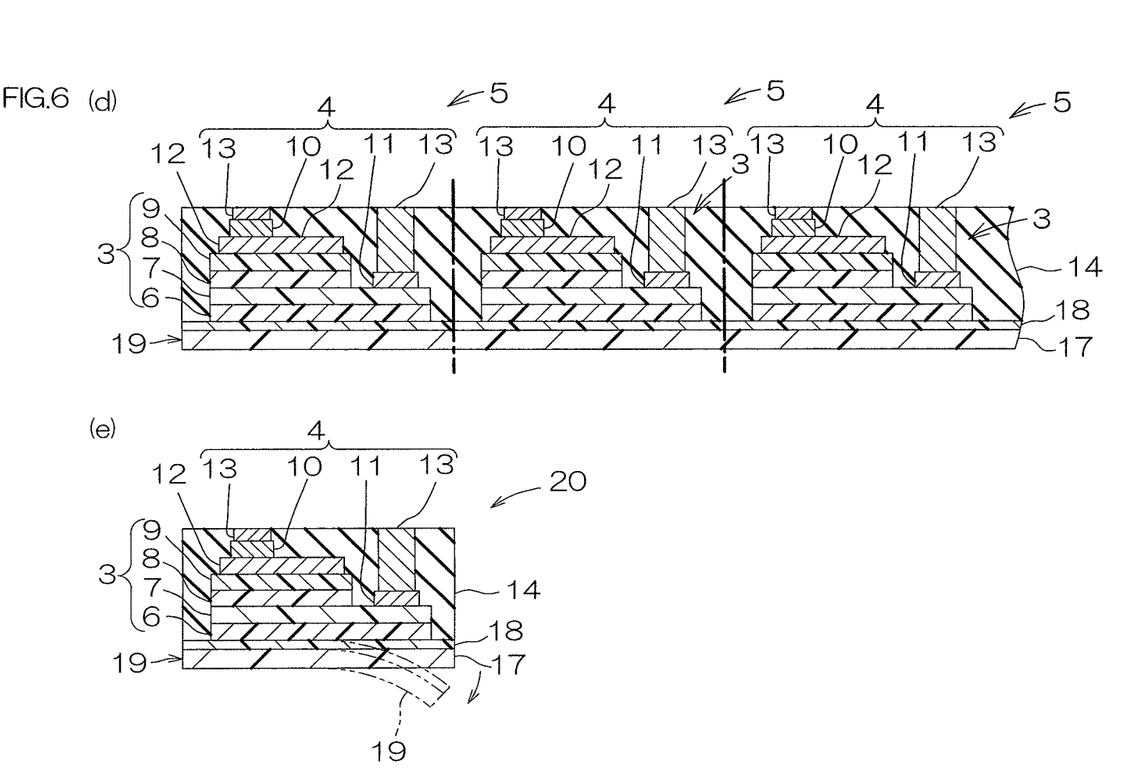
FIG. 6 shows, subsequent to FIG. 5, a process drawing describing a method for producing the light-emitting diode device shown in FIG. 4,
 (d) illustrating a step of removing the upper portion of the encapsulating resin layer, and thereafter, cutting into light-emitting diode elements by dicing, and
 (e) illustrating a step of releasing the release plate from the light-emitting diode element.

FIG. 4 shows a cross-sectional view of a light-emitting diode device in another embodiment of the light-emitting diode device of the present invention (embodiment in which the bottom face and the side face of the optical semiconductor layer of the light-emitting diode element is encapsulated with the encapsulating resin layer); FIG. 5 and FIG. 6 are process drawings describing a method for producing the light-emitting diode device shown in FIG. 4. Members corresponding to the above-described components are given the same reference numerals in the following figures, and detailed description thereof is omitted.

In embodiments of FIG. 1 to FIG. 3, the bottom face of the optical semiconductor layer 3 is encapsulated with the encapsulating resin layer 14 (FIG. 1 and FIG. 2). However, for example, as shown in FIG. 4, both of the bottom face and the side face of the optical semiconductor layer 3 can also be encapsulated.

To be specific, with the encapsulating resin layer 14, in addition to the above-described faces of the optical semiconductor layer 3, the side face of the buffer layer 6 and the side face of the N-semiconductor layer 7 are covered.

Next, a method for producing the light-emitting diode device 21 shown in FIG. 4 is described with reference to FIG. 5 and FIG. 6.

First, in this method, as shown in FIG. 5 (*a*), a plurality of light-emitting laminates 5 including the optical semiconductor layer 3 and the electrode unit 4 are prepared.

The plurality of light-emitting laminates 5 are obtained, for example, by laminating a plurality of optical semiconductor layers 3 and a plurality of electrode units 4 sequentially on the support substrate 2 (ref: FIG. 3); then, cutting (die cut) the support substrate 2; and thereafter releasing the support substrate 2.

Next, in this method, as shown in FIG. 5 (*b*), the plurality of light-emitting laminates 5 are bonded on the top face of the release plate 19.

The release plate 19 is generally a flat plate, and formed so as to include the light-emitting laminate 5 when the release plate 19 is projected in the thickness direction.

The release plate 19 is a release sheet that supports the light-emitting laminate 5 (ref: FIG. 5 (*a*) to FIG. 5 (*c*) and FIG. 6 (*d*)), and thereafter is released from the light-emitting laminate 5 encapsulated with the encapsulating resin layer 14.

To be specific, the release plate 19 includes a support layer 17, and an adhesive layer 18 laminated on the top face of the support layer 17.

The support layer 17 is formed, for example, from a heat resistant resin such as polyester.

The adhesive layer 18 has, for example, adhesiveness at normal temperature (25° C.), and the adhesiveness is reduced (or lost) when heated. To be specific, the adhesive layer 18 is composed of an adhesive that is capable of keeping its adhesive force at the time of heating for the molding of the encapsulating resin layer 14, but reduces its adhesiveness by being heated at a temperature higher than the molding temperature. To be specific, the adhesive layer 18 is formed of a thermal expansion adhesive.

For the above-described release plate 19, a commercially available product can be used, to be specific, REVALPHA® series (manufactured by Nitto Denko Corporation) can be used.

The release plate 19 reliably supports the light-emitting laminate 5 by the support layer 17 with the adhesive layer 18 interposed therebetween, while being released from the light-emitting laminate 5 based on reduction in adhesiveness of the adhesive layer 18 by heating thereafter.

To be specific, a plurality of light-emitting laminates 5 are temporary fixed (allowed to adhere) on the support layer 17 with the adhesive layer 18 interposed therebetween. The light-emitting laminates 5 are arranged in arrays on the adhesive layer 18 with a space provided therebetween.

Next, in this method, as shown in FIG. 5 (c), the encapsulating resin layer 14 is formed on the release plate 19 so as to cover the plurality of optical semiconductor layers 3 and the plurality of electrode units 4.

The encapsulating resin layer 14 covers at least side face (including the side face of the buffer layer 6 and the side face of the N-semiconductor layer 7) and the top face of the optical semiconductor layer 3, at least side face and the top face of the electrode unit 4, and the top face of the release plate 19 exposed from the optical semiconductor layer 3.

To be specific, the encapsulating resin composition is applied on the surface of the release plate 19 including the electrode unit 4 and the optical semiconductor layer 3, for example, by an application method using a laminator or an applicator to form a coating.

Thereafter, when the encapsulating material is a thermosetting resin, the coating is cured by heating.

Alternatively, when the encapsulating resin composition contains a powder thermosetting resin, the encapsulating resin layer 14 can also be molded by compression molding the encapsulating resin composition with a compression molding machine, while heating the encapsulating resin composition to be cured.

The encapsulating resin layer 14 is formed in this manner. That is, with the encapsulating resin layer 14, the optical semiconductor layer 3 and the electrode unit 4 are encapsulated.

Next, in this method, as shown by the solid line in FIG. 6 (d), the upper portion of the encapsulating resin layer 14 is partially removed so that the top face of the electrode unit 4 is exposed.

Then, as shown by the broken line (one dash) in FIG. 6 (d), the light-emitting laminate plate 1 is cut (die cut) into pieces of light-emitting diode elements 20.

To be specific, the encapsulating resin layer 14 between the optical semiconductor layers 3, and the release plate 19 formed therebelow are cut.

As shown in FIG. 6 (e), the plurality of light-emitting diode elements 20 with the release plate 19 provided on its reverse side are obtained in this manner.

Thereafter, as shown by the phantom line and arrow in FIG. 6 (e), the release plate 19 is released from the light-emitting diode element 20.

To release the release plate 19, the release plate 19 is heated, for example, to a temperature higher than the molding temperature.

Thereafter, as shown in FIG. 4, the light-emitting diode element 20 is turned upside down to be disposed to face the above-described base substrate 16, and then the light-emitting diode element 20 is flip chip mounted on the base substrate 16.

The light-emitting diode device 21 is obtained in this manner.

The light emitting diode device 21 and the light-emitting diode element 20 of FIG. 4 bring out the same operational advantage as that of the light emitting diode 21 and the light-emitting diode element 20 of FIG. 1, and furthermore, because the side face of the buffer layer 6 and the side face of the N-semiconductor layer 7 are encapsulated with the encapsulating resin layer 14, encapsulating characteristics of the peripheral end portion of the buffer layer 6 and the N-semiconductor layer 7 can be improved.

Figure 7:
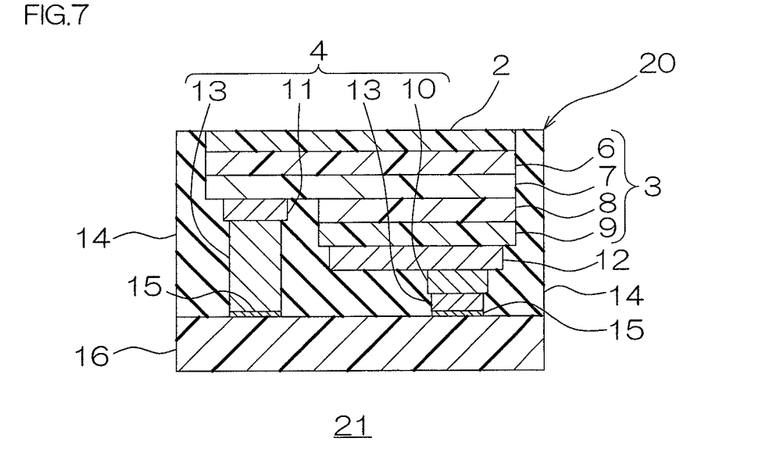
FIG. 7 shows a cross-sectional view of a light-emitting diode device in another embodiment of the light-emitting diode device of the present invention (embodiment in which the bottom face and side face of the optical semiconductor layer, and the side face of the support substrate of the light-emitting diode element are encapsulated with the encapsulating resin layer.
Figure 8A:
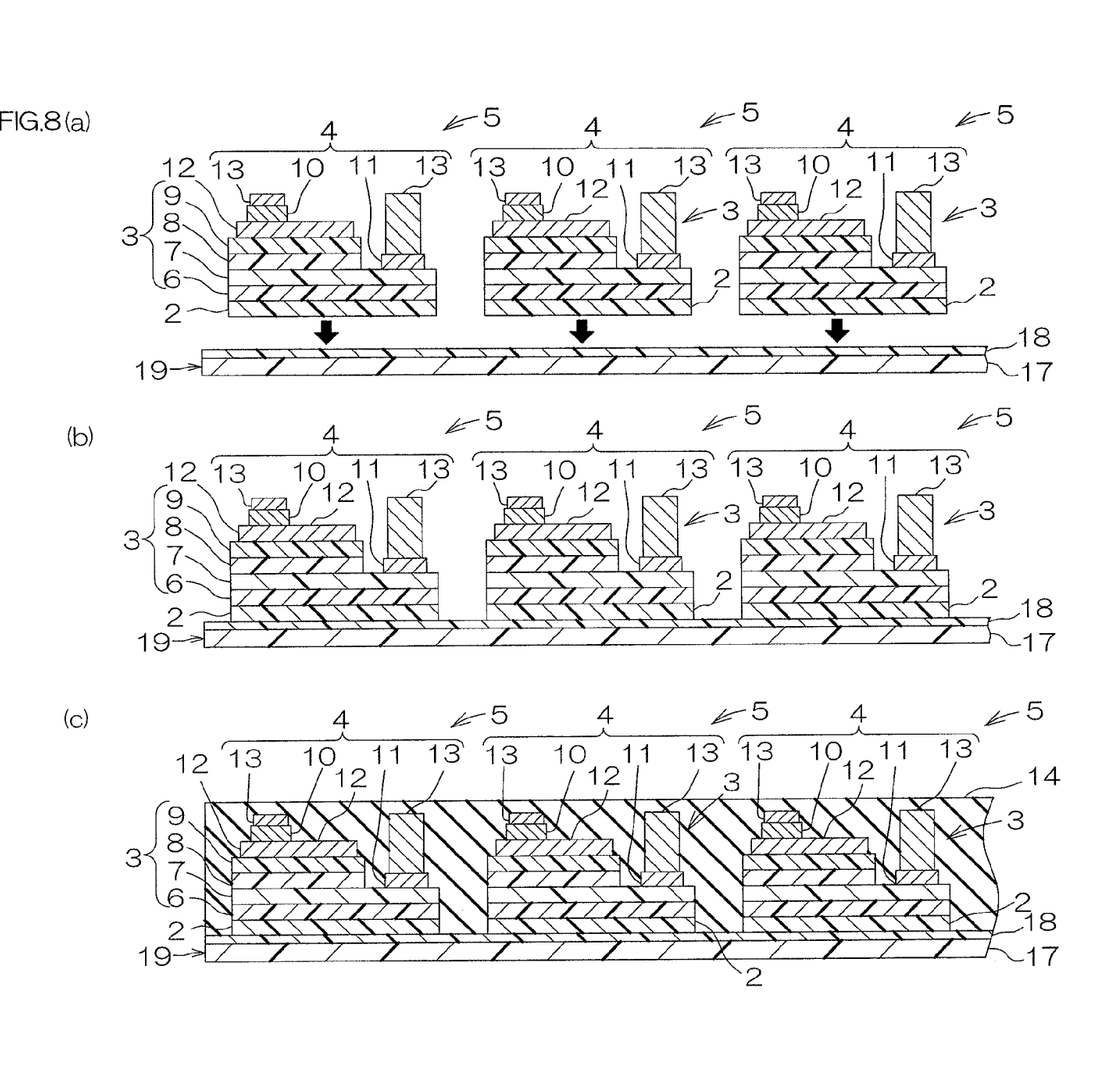
Figure 9:
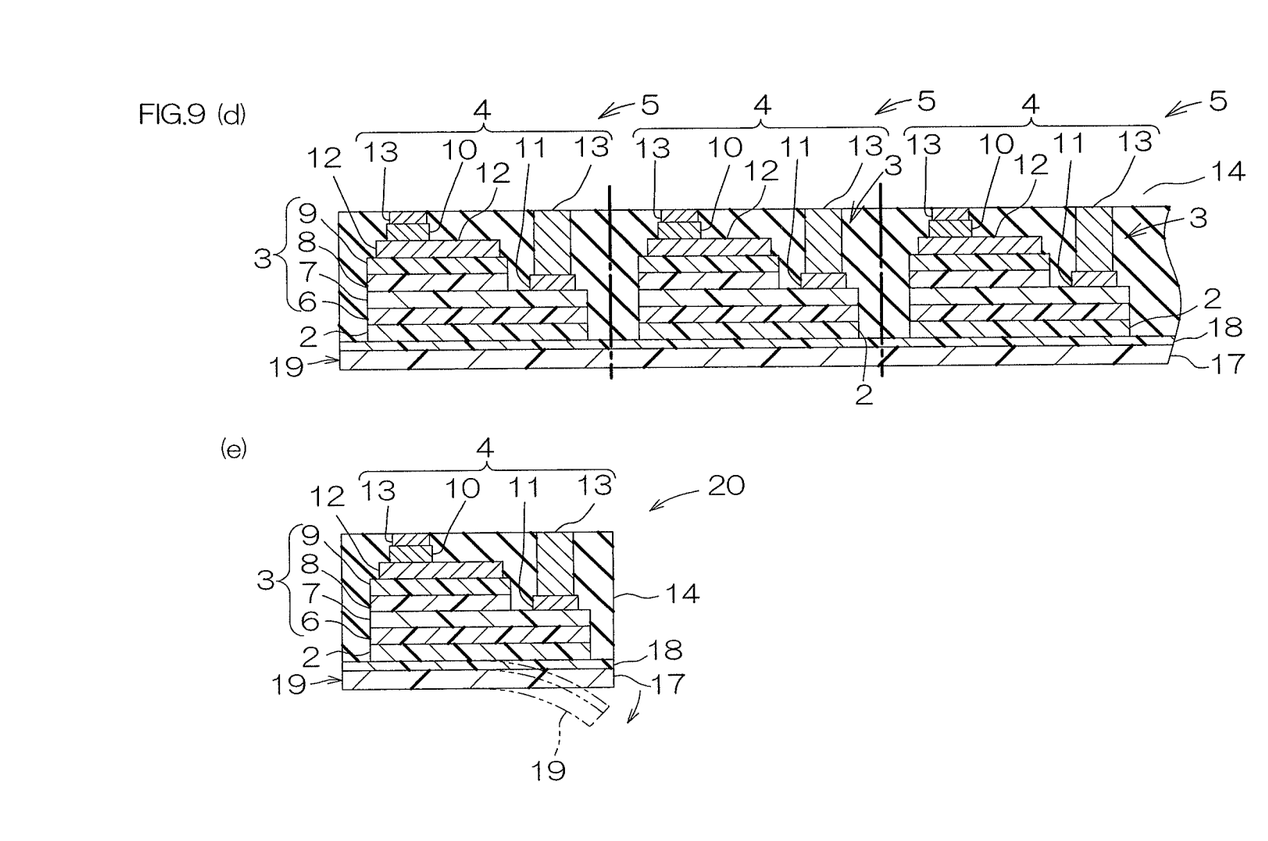
FIG. 9 shows, subsequent to FIG. 8, a process drawing describing a method for producing the light-emitting diode device shown in FIG. 7, (d) illustrating a step of removing the upper portion of the encapsulating resin layer, and thereafter, cutting into light-emitting diode elements by dicing, and (e) illustrating a step of releasing the release plate from the light-emitting diode element.

FIG. 7 shows a cross-sectional view of a light-emitting diode device in another embodiment of the light-emitting diode device of the present invention (embodiment in which the bottom face and the side face of the optical semiconductor layer of the light-emitting diode element, and the side face of the support substrate are encapsulated with the encapsulating resin layer), and FIG. 8 and FIG. 9 are process drawings describing a method for producing the light-emitting diode device shown in FIG. 7.

In embodiments of FIG. 4 to FIG. 6, particularly, as shown in FIG. 5 (a), the light-emitting laminate 5 from which the support substrate 2 is removed entirely is bonded onto the release plate 19. The light-emitting diode element 20 and the light-emitting diode device 21 can also be obtained by, for example, as shown by the phantom line in FIG. 3 (c) and FIG. 3 (d), and shown in FIGS. 7 to 9, using the light-emitting laminate 5 from which only the lower portion of the support substrate 2 is removed and having the upper portion of the support substrate 2 remained.

As shown in FIG. 7, in the light-emitting diode device 21, the light-emitting diode element 20 includes the support substrate 2 laminated on the entire top face of the buffer layer 6.

On the side face of the support substrate 2, the encapsulating resin layer 14 is formed so as to cover the side face of the support substrate 2, thereby allowing the side face of the support substrate 2 to be encapsulated with the encapsulating resin layer 14.

Next, a method for producing the light-emitting diode device 21 shown in FIG. 7 is described with reference to FIG. 8 and FIG. 9.

First, in this method, as shown in FIG. 8 (a), a plurality of light-emitting laminates 5 including the support substrate 2, the optical semiconductor layer 3, and the electrode unit 4 are prepared.

The light-emitting laminate 5 is obtained, as shown in FIG. 3: for example, a plurality of optical semiconductor layers 3 and a plurality of electrode units 4 are sequentially laminated on the support substrate 2; thereafter, only the lower portion of the support substrate 2 is removed, allowing the upper portion of the support substrate 2 to remain; and thereafter, the light-emitting laminate plate 1 is cut (die cut). That is, the light-emitting laminates 5 of FIG. 8 (a) are, although not shown, the plurality of light-emitting laminates 5 before encapsulated with the encapsulating resin layer 14, and with the upper portion of the support substrate 2 remained.

Next, in this method, as shown in FIG. 8 (b), a plurality of light-emitting laminates 5 are bonded onto the top face of the release plate 19.

To be specific, the plurality of light-emitting laminates 5 are bonded onto the top face of the release plate 19 with a space provided therebetween in the surface direction.

Next, in this method, as shown in FIG. 8 (c), the encapsulating resin layer 14 is formed on the release plate 19 so as to cover the plurality of support substrates 2, the plurality of light-emitting laminates 5, and the plurality of electrode units 4.

The encapsulating resin layer 14 covers the side face of the support substrate 2, the side face and the top face of the optical semiconductor layer 3, and the top face of the release plate 19 exposed from the support substrate 2.

The encapsulating resin layer 14 is also laminated on the top face of the release plate 19 exposed from the support substrate 2.

Then, the encapsulating resin layer 14 encapsulates the support substrate 2, the optical semiconductor layer 3, and the electrode unit 4.

Next, in this method, as shown in the solid line in FIG. 9 (d), the upper portion of the encapsulating resin layer 14 is partially removed so that the top face of the electrode unit 4 is exposed.

Then, as shown by the broken line (one dash) in FIG. 9 (d), the light-emitting laminate plate 1 is cut (die cut) into pieces of light-emitting diode elements 20.

To be specific, the encapsulating resin layer 14 between the optical semiconductor layers 3, and the release plate 19 formed therebelow are cut.

The light-emitting diode element 20 with the release plate 19 provided on its reverse side as shown in FIG. 9 (e) is obtained in this manner.

Thereafter, as shown by the phantom line and the arrow in FIG. 9 (e), the release plate 19 is released from the light-emitting diode element 20.

Thereafter, as shown in FIG. 7, the light-emitting diode element 20 is turned upside down to be disposed to face the above-described base substrate 16, and thereafter the light-emitting diode element 20 is flip chip mounted on the base substrate 16.

The light-emitting diode device 21 is obtained in this manner.

The light emitting diode 21 and the light-emitting diode element 20 of FIG. 7 bring out the same operational advantage as that of the light emitting diode 21 and the light-emitting diode element 20 of FIG. 4, and furthermore, because the support substrate 2 is provided, in cutting (die cutting) of the light-emitting laminate plate 1 as shown by the broken line (one dash) of FIG. 9 (d), damages to the electrode unit 4 can be effectively prevented.

EXAMPLES

While in the following, the present invention will be described with reference to Examples and Comparative Examples, the present invention is not limited thereto.

Example 1

A light-emitting laminate plate including a support substrate, an optical semiconductor layer formed thereon, and an electrode unit formed thereon was prepared (ref: FIG. 3 (a)).

To prepare a light-emitting laminate plate, first, a support substrate composed of sapphire and having a thickness of 450 µm was prepared, and then the following were laminated in the above-described pattern sequentially on the support substrate by epitaxy: a buffer layer composed of GaN and having a thickness of 30 nm; an N-semiconductor layer composed of Si-doped N—GaN (hereinafter referred to as n-GaN: Si) and having a thickness of 5 µm; a light-emitting layer composed of InGaN and having a thickness of 120 nm; and a P-semiconductor layer composed of n-GaN: Mg and having a thickness of 50 nm. The light-emitting layer and the P-semiconductor layer were formed into the above-described pattern by etching after epitaxy.

Thereafter, a transparent electrode composed of ITO and having a thickness of 50 nm was formed on the P-semiconductor layer, and then an anode composed of gold and having a thickness of 50 nm was formed on the transparent electrode. At the same time, a cathode composed of gold and having a thickness of 50 nm was formed on the N-semiconductor layer.

Then, bumps composed of gold were formed on the anode and on the cathode.

The thickness of the bump on the anode and the thickness of the bump on the cathode were adjusted so that their heights were the same when the top faces of these bumps were projected in the surface direction.

Then, the encapsulating resin layer was formed on the optical semiconductor layer so as to cover the electrode unit (ref: FIG. 3 (b)).

To be specific, first, 100 parts by mass of a thermosetting silicone resin, and 20 parts by mass of spherical titanium oxide ($TiO_2$: rutile tetragonal system) particles having an average particle size of 300 nm were mixed uniformly, thereby preparing a paste encapsulating resin composition. Then, the prepared encapsulating resin composition was applied on the optical semiconductor layer including the electrode unit, thereby forming a semi-cured (B-STAGE) coating. Thereafter, the coating was cured by heating. The top face of the encapsulating resin layer was formed above the top face of the bumps by 30 µm (L1).

Thereafter, the support substrate was removed from the optical semiconductor layer by etching (ref: solid line in FIG. 3 (c)).

Then, the upper portion of the encapsulating resin layer (thickness 30 µm) was removed by grinding so that the top face of the electrode unit was exposed. The upper portion of the encapsulating resin layer was removed so that the top face of the electrode unit was flush with the top face of the encapsulating resin layer surrounding the electrode unit (ref: solid line in FIG. 3 (d)).

A plurality of light-emitting diode elements were thus formed integrally.

Thereafter, the light-emitting laminate plate was die cut, cutting out light-emitting diode elements from the light-emitting laminate plate (ref: broken line (one dash) in FIG. 3 (d)).

Thereafter, the light-emitting diode elements were reversed, and a base substrate having a thickness of 1 mm was prepared. In the base substrate, a conductor layer including terminals composed of copper, nickel, and gold was laminated on the surface of an insulating substrate composed of sapphire ($Al_2O_3$). The light-emitting diode element and the base substrate were disposed to face each other (ref: FIG. 2).

Thereafter, the bumps were allowed to reflow by heating so that the bumps and the terminals were brought into contact with each other, and these were electrically connected directly, thereby flip chip mounting the light-emitting diode element on the base substrate (ref: FIG. 1). A light-emitting diode device was made in this manner.

Example 2

A light-emitting diode element was obtained in the same manner as in Example 1, except that only the lower portion (thickness 420 µm) of the support substrate was removed (ref: phantom line in FIG. 2 (c)) instead of removing the support substrate entirely from the optical semiconductor layer (ref: solid line in FIG. 2 (c)), and then the light-emitting diode element was flip chip mounted on the base substrate, thereby producing a light-emitting diode device (ref: phantom line in FIG. 1).

That is, as shown in the phantom line in FIG. 1, the lower portion of the support substrate remained, and the lower portion had a thickness of 30 µm.

Example 3

A plurality of light-emitting laminates including an optical semiconductor layer and an electrode unit were prepared (ref: FIG. 5 (a)). The light-emitting laminates were obtained by cutting out the light-emitting laminate plate on which the plurality of light-emitting laminates were provided.

Then, the plurality of light-emitting laminates were arranged in arrays with a space provided therebetween on a release plate (REVALPHA® series, manufactured by Nitto Denko Corporation) (ref: FIG. 5 (b)).

Then, the encapsulating resin layer was formed on the release plate so as to cover the optical semiconductor layer and the electrode unit (ref: FIG. 5 (c)).

That is, the encapsulating resin composition of Example 1 was applied on the surface of the release plate including the electrode unit and the optical semiconductor layer, thereby forming a semi-cured (B-STAGE) coating. Thereafter, the coating was cured by heating.

Then, the upper portion of the encapsulating resin layer was ground so that the top face of the electrode unit was exposed (ref: solid line in FIG. 6 (d)).

Then, the light-emitting laminate plate was die cut, thereby producing a plurality of light-emitting diode elements (ref: broken line (one dash) in FIG. 6 (d)).

Thereafter, the light-emitting diode element was turned upside down to be disposed to face the base substrate, and then the light-emitting diode element was flip chip mounted on the base substrate (ref: FIG. 4).

Example 4

The plurality of light-emitting laminates including a support substrate, an optical semiconductor layer, and an electrode unit were prepared (ref: FIG. 8 (a)). The light-emitting laminates were obtained by cutting out the light-emitting laminate plate on which the plurality of light-emitting laminates were provided.

Then, the plurality of light-emitting laminates were arranged in arrays with a space provided therebetween on a release plate (REVALPHA® series, manufactured by Nitto Denko Corporation)(ref: FIG. 8 (b)).

Then, the encapsulating resin layer was formed on the release plate so as to cover the support substrate, the optical semiconductor layer, and the electrode unit (ref: FIG. 8 (c)).

That is, the encapsulating resin composition of Example 1 was applied on the surface of the release plate including the electrode unit, the optical semiconductor layer, and the support substrate, thereby forming a semi-cured (B-STAGE) coating. Thereafter, the coating was cured by heating.

Then, the upper portion of the encapsulating resin layer was ground so that the top face of the electrode unit was exposed (ref: broken line (one dash) in FIG. 9 (d)).

Then, the light-emitting laminate plate was die cut, thereby producing a plurality of light-emitting diode elements (ref: broken line (one dash) in FIG. 9 (d)).

Thereafter, the light-emitting diode element was turned upside down to be disposed to face the base substrate, and then the light-emitting diode element was flip chip mounted on the base substrate (ref: FIG. 7).

Comparative Example 1

A light-emitting diode device was made in the same manner as in Example 1, except that the encapsulating resin composition did not contain the light reflection component, and as shown in FIG. 10, a diffusion film (30)(aluminum-made, thickness 100 nm) was provided on the surface of the optical semiconductor layer.

Comparative Example 2

A light-emitting diode element was obtained in the same manner as in Example 1, except that the upper portion of the encapsulating resin layer (ref: FIG. 3 (b)) was not ground, and a light-emitting diode device was obtained by bonding the light-emitting diode element onto the base substrate.

Evaluation

1. Examination of Electrode Unit

The light-emitting diode devices of Examples 1 to 4 and Comparative Example 1 were cut along the thickness direction, thereby producing samples. The sample electrode units were observed with a scanning electron microscopy (SEM), and it was confirmed that no damages were found on the electrode units.

2. Measurement on Light Extraction Efficiency

The light-extraction efficiency of light-emitting diode devices of Examples 1 to 4, and Comparative Examples 1 and 2 were obtained by calculation based on the radiant flux.

It was confirmed from the result that the light-extraction efficiencies of the light-emitting diode devices of Examples 1 to 4 and Comparative Example 1 were higher than that of the light-emitting diode devices of Comparative Example 2 by 10%, 3%, 10%, 3%, and 10%, respectively.

While the illustrative embodiments of the present invention are provided in the above description, such is for illustrative purpose only and it is not to be construed as limiting the scope of the present invention. Modifications and variations of the present invention that will be obvious to those skilled in the art is to be covered by the appended claims.

What is claimed is:

1. A light-emitting diode element comprising:
an optical semiconductor layer,
an electrode unit formed on one surface of the optical semiconductor layer,
a bump formed on one surface of the electrode unit, and
an encapsulating resin layer that encapsulates the optical semiconductor layer, the electrode unit, and the bump, the encapsulating resin layer containing a light reflection component,
wherein the surface of the bump is exposed such that the light-emitting diode element is flip chip mounted on a base substrate, and
the bump is not electrically connected to the base substrate configured to supply electric power to the optical semiconductor layer before attaching the base substrate to the light-emitting diode element.

2. The light-emitting diode element according to claim 1, wherein the encapsulating resin layer covers a surface exposed from the electrode unit in the optical semiconductor layer.

3. The light-emitting diode element according to claim 1, further comprising a release plate arranged on a surface of the optical semiconductor layer where the electrode unit is not formed, wherein the release plate includes:

a support layer formed from a resin, and
an adhesive layer arranged between the support layer and the surface of the optical semiconductor element.

4. The light-emitting diode element according to claim 3, wherein the resin is a heat resistant resin, and the adhesiveness of the adhesive layer is reduced when heated.

\* \* \* \* \*